(12) United States Patent
Yuki et al.

(10) Patent No.: US 7,535,985 B2
(45) Date of Patent: May 19, 2009

(54) RESYNCHRONIZATION CIRCUIT

(75) Inventors: Hisanori Yuki, Osaka (JP); Takefumi Yoshikawa, Hyogo (JP); Takashi Hirata, Osaka (JP)

(73) Assignee: Panasonic Corporation, Osaka (JP)

( * ) Notice: Subject to any disclaimer, the term of this patent is extended or adjusted under 35 U.S.C. 154(b) by 544 days.

(21) Appl. No.: 11/113,172

(22) Filed: Apr. 25, 2005

(65) Prior Publication Data
US 2005/0237822 A1 Oct. 27, 2005

(30) Foreign Application Priority Data
Apr. 26, 2004 (JP) ............................. 2004-129283

(51) Int. Cl.
*H04L 7/00* (2006.01)
(52) U.S. Cl. .................................................... 375/371
(58) Field of Classification Search ......... 375/371–376; 365/189.05; 327/7, 12, 40, 45, 88, 144, 145, 327/170, 231, 263
See application file for complete search history.

(56) References Cited

U.S. PATENT DOCUMENTS 5,587,743 A * 12/1996 Montgomery et al. ....... 348/473

2002/0051510 A1 * 5/2002 Noguchi ..................... 375/376
2003/0053489 A1 * 3/2003 Zerbe et al. ................. 370/503

FOREIGN PATENT DOCUMENTS

| JP | 2001-520417 | 10/2001 |
| WO | WO 99/19806 | 4/1999 |

* cited by examiner

*Primary Examiner*—David C Payne
*Assistant Examiner*—Rahel Guarino
(74) *Attorney, Agent, or Firm*—McDermott Will & Emery LLP

(57) ABSTRACT

A resynchronization circuit possesses a sufficient migration margin even when the speed of a clock signal used for outputting data is increased, so that the data transfer speed can be increased. In the resynchronization circuit, a determination circuit holds a signal which is determined according to the phase difference between a determination signal and a reference clock signal (determination result). In a synchronization circuit block, a received data signal is held in synchronization with a strobe signal. Then, the received data signal is held in synchronization with a clock signal which has the same frequency as that of the reference clock signal and has a phase determined according to the determination result and output from the resynchronization circuit.

20 Claims, 12 Drawing Sheets

FIG. 3

| strobeTrise | Flip flop 1111 | Flip flop 1112 | Flip flop 1113 | Flip flop 1114 | AND circuit 1121 | AND circuit 1122 | AND circuit 1123 | AND circuit 1124 | rsync_late | rsync_chph |
|---|---|---|---|---|---|---|---|---|---|---|
| 090-180 | (0) | (1) | 1 | 0 | 1 | 0 | 0 | (0) | 0 | 0 |
| 180-270 | 0 | (0) | (1) | 1 | 0 | 1 | 0 | (0) | 0 | 1 |
| 270-000 | 1 | 0 | (0) | (1) | 0 | 0 | 1 | (0) | 1 | 0 |
| 000-090 | (1) | 1 | 0 | (0) | 0 | 0 | 0 | (1) | 1 | 1 |

RESYNCHRONIZATION CIRCUIT

CROSS-REFERENCE TO RELATED APPLICATIONS

This Nonprovisional application claims priority under 35 U.S.C. §119(a) on Patent Application No. 2004-129283 filed in Japan on Apr. 26, 2004, the entire contents of which are hereby incorporated by reference.

BACKGROUND OF THE INVENTION

1. Field of the Invention

The present invention relates to a resynchronization circuit used for transferring data between circuits which use clock signals of the same frequency but different phases, wherein data which is in synchronization with one of the clock signals is resynchronized with the other clock signal, and the resynchronized data is output from the resynchronization circuit.

2. Description of the Prior Art

For example, a system LSI circuit for controlling read and write operations of a memory has a resynchronization circuit for achieving transfer of data which is output from the memory in synchronization with a reception-side clock signal to a circuit which operates in synchronization with a system clock signal having the same frequency as that of the reception-side clock signal but a different phase from that of the reception-side clock signal in the process of controlling a read operation. Specifically, the resynchronization circuit resynchronizes the data with the system clock signal (i.e., allows the data to migrate to the system clock signal) to output the resynchronized data.

An example of such a synchronization circuit is disclosed in Japanese National Phase PCT Laid-Open Publication No. 2001-520417. The synchronization circuit disclosed in this publication includes a flip flop for holding received data at a rising edge of a system clock signal and a flip flop for holding the received data at a falling edge of the system clock signal. The output of any one of the flip flops is selected according to the phase difference between a reception-side clock signal and the system clock signal, and the selected output is held in synchronization with the system clock and then output from the synchronization circuit.

With such a structure, data which is in synchronization with the reception-side clock signal can be resynchronized with the system clock signal.

However, since the conventional resynchronization circuit is designed such that received data is held at a rising or falling edge of the system clock signal, the data can be held at a timing away from the center of a period during which the data is effectively output. Thus, as the speed of the reception-side clock signal, or the like, increases (i.e., as the frequency of the reception-side clock signal, or the like, increases), latching of the data becomes more difficult (i.e., the migration margin decreases), and accordingly, it becomes more difficult to increase the speed of data transfer.

SUMMARY OF THE INVENTION

The present invention was conceived in view of the above problems. An objective of the present invention is to provide a resynchronization circuit which has a migration margin sufficient for an increase in speed of a clock signal used for outputting data such that the speed of data transfer can be increased.

In order to achieve the above objective, the present invention provides a resynchronization circuit for synchronizing a received data signal with a reference clock signal which has a frequency equal to that of a strobe signal, the strobe signal being input to the resynchronization circuit together with the received data signal, comprising: a reception timing detection circuit for detecting in which of a plurality of phase ranges within one cycle of the reference clock signal the timing of determining the level of the received data signal occurs; a first holding circuit for holding the received data signal in synchronization with the strobe signal; a second holding circuit for holding an output of the first holding circuit in synchronization with a second holding circuit clock signal, the second holding circuit clock signal having the same frequency as that of the reference clock signal, the level of the second holding circuit clock signal transitioning in a phase range different from the phase range detected by the reception timing detection circuit; and a third holding circuit for holding an output of the second holding circuit in synchronization with the reference clock signal.

In one embodiment of the present invention, the resynchronization circuit further comprises a plurality of holding circuits for holding the output of the first holding circuit in synchronization with a plurality of said second holding circuit clock signals, the plurality of second holding circuit clock signals having the same frequency as that of the reference clock signal, the levels of the plurality of second holding circuit clock signals transitioning in different phase ranges from one another, wherein the second holding circuit holds a signal which is selected from the signals held by the plurality of holding circuits.

In one embodiment of the present invention, the second holding circuit holds the output of the first holding circuit in synchronization with a clock signal selected from a plurality of said second holding circuit clock signals, the plurality of second holding circuit clock signals having the same frequency as that of the reference clock signal, the levels of the plurality of second holding circuit clock signals transitioning in different phase ranges from one another.

In one embodiment of the present invention, the reception timing detection circuit includes a plurality of holding circuits for holding a detection data signal in synchronization with a plurality of detection clock signals, the level of the detection data signal transitioning at the timing of determining the level of the received data signal, the detection clock signals having the same frequency as that of the reference clock signal, the levels of the plurality of detection clock signals transitioning in different phase ranges from one another; and the reception timing detection circuit performs the detection based on the levels of the signals held by the plurality of holding circuits.

In one embodiment of the present invention, the level of the received data signal is periodically inverted; and the detection data signal is a signal generated by holding the received data signal by the first holding circuit.

With the above features, in which of the phase ranges within one cycle of the reference clock signal the level transition of the detection data signal occurs is detected. As a result, transfer of the received data signal can be achieved with a sufficient migration margin.

In one embodiment of the present invention, the detection data signal is a signal generated by dividing the frequency of the strobe signal.

With this feature, if a circuit for dividing the frequency of the strobe signal and the first holding circuit are formed from flip flops of the same type, it is possible to generate a detection data signal which is precisely in synchronization with the output of the first holding circuit.

In one embodiment of the present invention, the detection data signal is a signal generated by delaying the strobe signal by a time equal to a delay of the first holding circuit.

With this feature, it is possible to generate a detection data signal which is precisely in synchronization with the output of the first holding circuit.

In one embodiment of the present invention, the reception timing detection circuit holds a signal generated by delaying the detection data signal by a predetermined delay.

In one embodiment of the present invention, the plurality of phase ranges have the same extent; and the predetermined delay by which the detection data signal is delayed is equal to a half of the extend of one phase range.

With the above features, it is possible to hold the received data signal at a timing closer to the midpoint of a period where the received data signal is output as a valid signal and output the held received data signal.

In one embodiment of the present invention, the reception timing detection circuit performs the detection during a predetermined detection period; and the second holding circuit holds the output of the first holding circuit after the detection of the reception timing detection circuit.

With this feature, the detection of the reception timing detection circuit is performed within a predetermined period. Thus, it is possible to transfer the received data signal with a sufficient migration margin even when the resynchronization circuit of the present invention is incorporated in a system LSI circuit for controlling read and write operations of a memory in/from which data is input/output based on a strobe signal which has a period when the level is periodically inverted and a period when the level does not change (i.e., a signal which intermittently has a predetermined frequency).

In one embodiment of the present invention, the received data signal is a video data signal; and the reception timing detection circuit performs the detection during a blanking interval of the video data signal.

With this feature, in which of the phase ranges within one cycle of the reference clock signal the timing of determining the level of the video data signal occurs is detected in a blanking interval of the video data signal. Thus, for example, the received data signal can be precisely transferred even when the resynchronization circuit of the present invention is incorporated in a system LSI circuit for controlling read and write operations of a video memory in which a fast operation is required.

In one embodiment of the present invention, the received data signal is output by a memory which has a refresh interval; and the reception timing detection circuit performs the detection during the refresh interval of the memory.

With this feature, the detection of the reception timing detection circuit is carried out during a refresh interval of a memory. Thus, transfer of the received data signal can be precisely performed.

In one embodiment of the present invention, the reception timing detection circuit performs the detection during a period when noise included in the detection data signal is equal to or less than a predetermined level.

With this feature, in the reception timing detection circuit, it is possible to precisely determine in which of the phase ranges within one cycle of the reference clock signal the timing of determining the level of the received data signal occurs.

BRIEF DESCRIPTION OF THE DRAWINGS

FIG. 3 shows a truth table of the determination circuit.

DESCRIPTION OF THE PREFERRED EMBODIMENTS

A resynchronization circuit according to an embodiment of the present invention is incorporated in a system LSI circuit for controlling read and write operations of a memory to/from which data is input/output based on a strobe signal which has a period when the logical value is periodically inverted and a period when the logical value does not change (i.e., a signal which intermittently has a predetermined frequency), such as a DDR-SDRAM (Double Data Rate Synchronous DRAM), or the like.

Hereinafter, embodiments of the present invention are described with reference to the drawings.

Embodiment 1

(General Structure)

Figure 1:
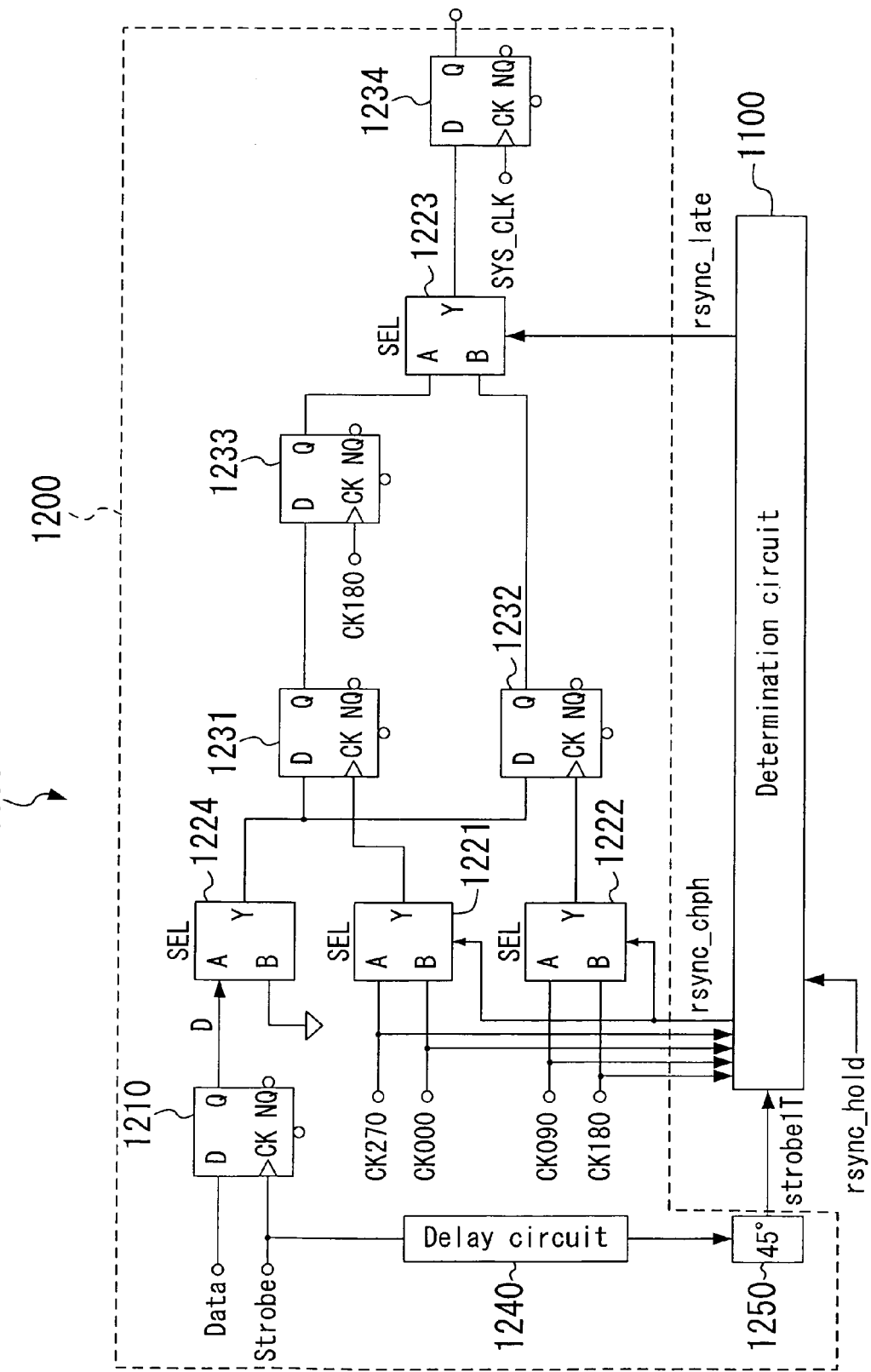
FIG. 1 is a block diagram showing a structure of a resynchronization circuit according to embodiment 1 of the present invention.

FIG. 1 is a block diagram showing a structure of a resynchronization circuit 1000 according to embodiment 1 of the present invention. In the first place, the general structure of the resynchronization circuit is described.

As shown in FIG. 1, the resynchronization circuit 1000 includes a determination circuit 1100 and a synchronization circuit block 1200.

The determination circuit 1100 is controlled by a control circuit (not shown) to determined how much phase difference an determination signal (described later) input to determination circuit 1100 and a reference clock signal (SYS_CLK) have. The determination circuit 1100 decodes the determination result, holds the decoded determination result and, in the meantime, outputs the decoded determination result to a synchronization circuit block 1200. The determination result is output as a signal that is determined according to in which phase range the reference clock signal rises, the range of 90° to 180°, the range of 180° to 270°, the range of 270° to 0°, or the range of 0° to 90°, as described later. (It should be noted that the phase range of 90° to 180°, for example, includes 90° but does not include 180°. This applies to the other phase ranges.)

The resynchronization circuit of embodiment 1 is controlled by the control circuit such that the determination operation is carried out during a period when an operation of receiving an actual received data signal is not performed.

The synchronization circuit block 1200 holds the input received data signal in synchronization with the strobe signal (Strobe) and then holds the received data signal at the same frequency as that of the reference clock signal in synchronization with a clock signal having a phase which is determined based on the determination result, whereby the migration margin is increased. Thereafter, the synchronization circuit block 1200 reholds the data in synchronization with the reference clock signal and outputs the reheld data.

(Specific Structure of Determination Circuit 1100)

Figure 2:
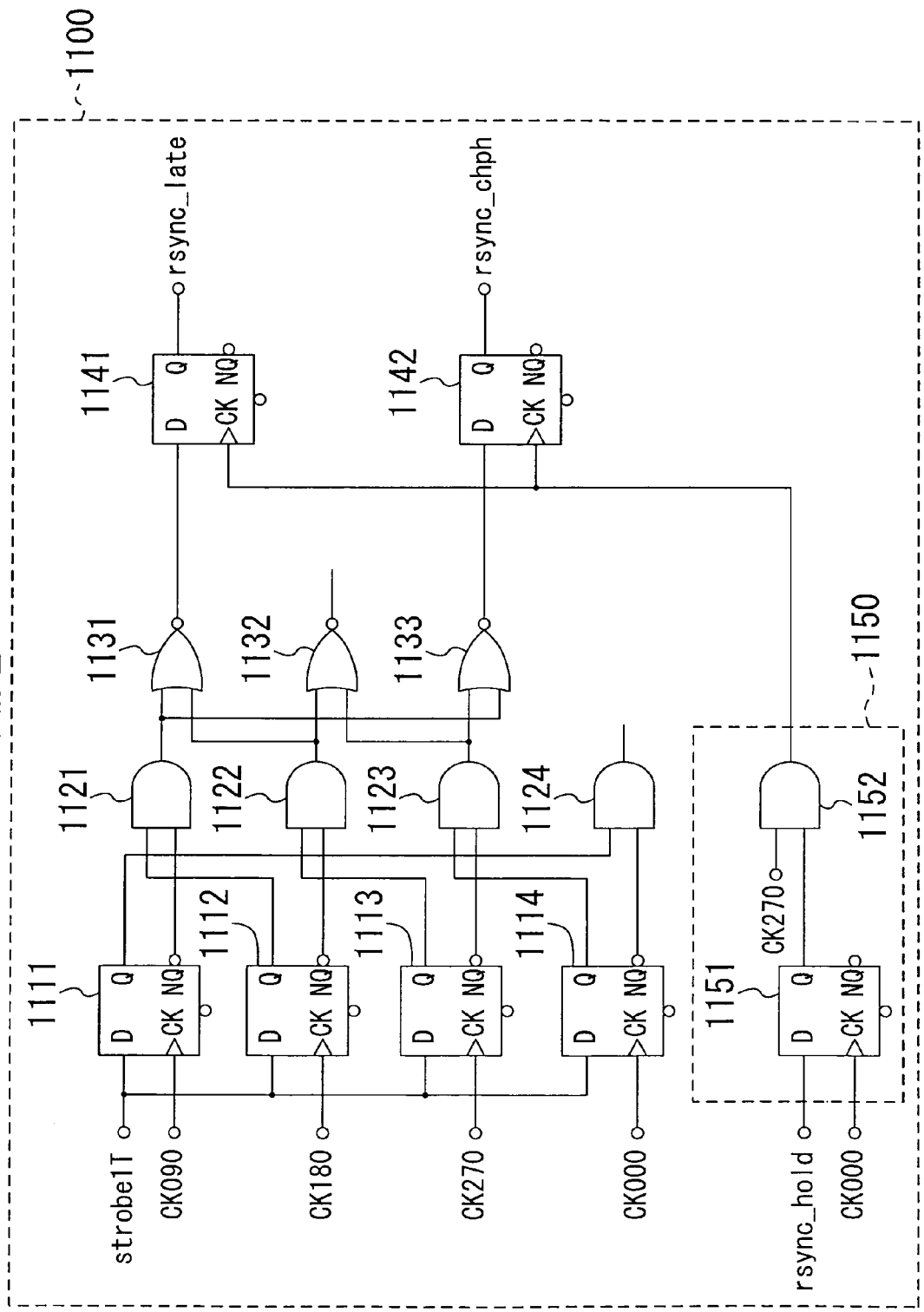
FIG. 2 is a block diagram showing a structure of a determination circuit.

Next, a specific structure of the determination circuit 1100 is described. As shown in FIG. 2, the determination circuit 1100 includes flip flops 1111 to 1114, AND circuits 1121 to 1124, NOR circuits 1131 to 1133, flip flops 1141 and 1142, and an update control block 1150.

The determination circuit 1100 receives signal strobe1T, which is generated by delaying the strobe signal by delay circuits 1240 and 1250 (see FIG. 1), as a determination signal. The determination circuit 1100 performs the determination operation based on signal strobe1T.

The flip flops 1111 to 1114 receive clock signals (CK090, CK180, CK270 and CK000, respectively) which have the same frequency as that of the reference clock signal and different phases from one another. Each of the flip flops 1111 to 1114 holds signal strobe1T at a rising edge of the received clock signal and outputs the held signal (uninverted output) and an inverse of the uninverted output.

Clock signal CK000 has the same phase as that of the reference clock signal. The phases of clock signals CK090, CK180 and CK270 are delayed from that of the reference clock signal by 90°, 180° and 270°, respectively.

As a result of the above-described clock signals input to the flip flops 1111 to 1114, values which are determined according to in which phase range signal strobe1T rises, the range of 90° to 180°, the range of 180° to 270°, the range of 270° to 0°, or the range of 0° to 90°, are output from the respective flip flops.

The specific values output from the flip flops are shown in FIG. 3. In FIG. 3, "1" means that a signal output from the flip flop is at High level (H-level), and "0" means that a signal output from the flip flop is at Low level (L-level). Each of the columns of "flip flop 1111" to "flip flop 1114" shows the uninverted output of the flip flop which is output when signal strobe1T input thereto rises in the phase range of 90° to 180°, the phase range of 180° to 270°, the phase range of 270° to 0°, or the phase range of 0° to 90°.

Figure 4:
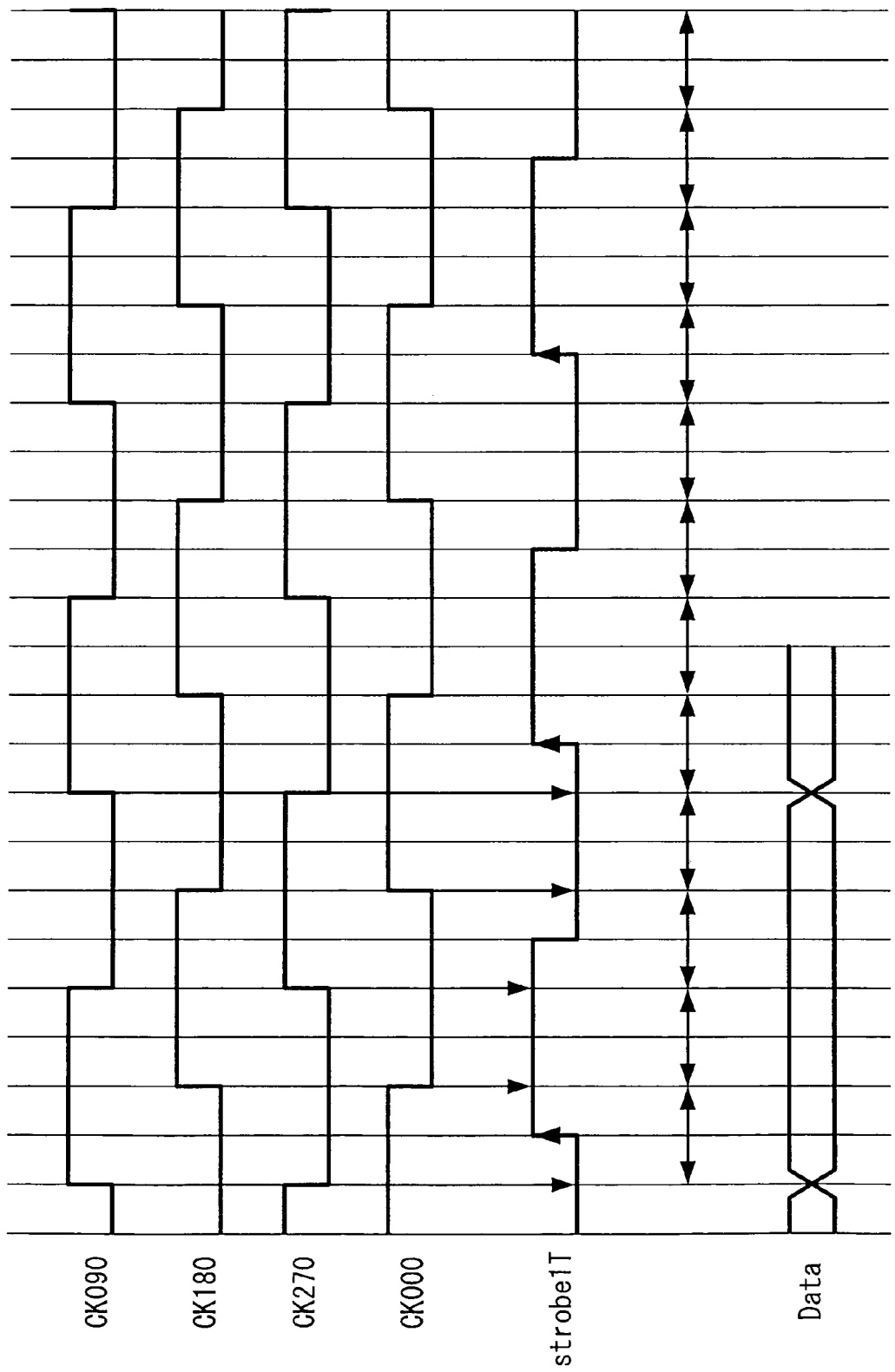
FIG. 4 is a timing chart of signals input to the determination circuit.

For example, when signal strobe1T rises in the phase range of 90° to 180° as shown in FIG. 4, the uninverted outputs of the flip flops 1111 to 1114 are at L-level, H-level, H-level, and L-level, respectively.

The AND circuits 1121 to 1124 and the NOR circuits 1131 to 1133 decode the signals output from the flip flops 1111 to 1114. The decoded signals are output from the NOR circuits 1131 and 1133.

Specifically, in FIG. 3, each of the columns of "AND circuit 1121" to "AND circuit 1124" shows the output of the AND circuit which is output when signal strobe1T input thereto rises in the phase range of 90° to 180°, the phase range of 180° to 270°, the phase range of 270° to 0°, or the phase range of 0° to 90°.

For example, when signal strobe1T rises in the phase range of 90° to 180°, the outputs of the AND circuits 1121 to 1124 are at H-level, L-level, L-level, and L-level, respectively. In this case, the outputs of the NOR circuits 1131 and 1133 are both at L-level.

The flip flops 1141 and 1142 hold the decoded output (determination result) and outputs the decoded output as two signals rsync_late and rsync_chph.

Specifically, in FIG. 3, the columns of "rsync_late" to "rsync_chph" show the outputs of the flip flops 1141 and 1142, respectively. When signal strobe1T which is input to the determination circuit 1100 rises in the phase range of 90° to 180°, the values held at the flip flops 1141 and 1142 are all at L-level.

The update control block 1150 is formed by a flip flop 1151 and a AND circuit 1152. The update control block 1150 updates the determination result held at the flip flops 1141 and 1142 according to a signal from the unshown control circuit which instructs updating of the determination result (rsync_hold). Signal rsync_hold is at H-level for a period equal to or longer than one cycle of signal SYS_CLK for the purpose of correct determination. Thus, the update of the determination result is carried out during a period when signal rsync_hold is at H-level, and the outputs of the NOR circuits 1131 and 1133 (determination result) which are obtained at the timing when signal rsync_hold transitions from H-level to L-level are held at the flip flops 1141 and 1142, respectively.

As described above, the determination result output by the determination circuit 1100 indicates in which of the four phase ranges the determination signal rises, the range of 0° to 90°, the range of 90° to 180°, the range of 180° to 270°, or the range of 270° to 0°. That is, the determination circuit 1100 outputs a signal which is determined according to in which phase range the reference clock signal rises, the range of 90° to 180°, the range of 180° to 270°, the range of 270° to 0°, or the range of 0° to 90°.

(Specific Structure of Synchronization Circuit Block 1200)

Next, a specific structure of the synchronization circuit block 1200 is described. As shown in FIG. 1, the synchronization circuit block 1200 includes a flip flop 1210, selectors 1221 to 1224, flip flops 1231 to 1234, the delay circuit 1240 and the delay circuit 1250.

The flip flop 1210 holds input data (Data) in synchronization with the strobe signal to output a received data signal (D). The received data signal (D) has a width equal to one cycle of the reference clock signal.

When signal rsync_chph is at L-level, the selector 1221 selects clock signal CK270. When signal rsync_chph is at H-level, the selector 1221 selects clock signal CK000.

When signal rsync_chph is at L-level, the selector 1222 selects clock signal CK090. When signal rsync_chph is at H-level, the selector 1222 selects clock signal CK180.

When signal rsync_late is at L-level, the selector 1223 selects the output of the flip flop 1233. When signal rsync_late is at H-level, the selector 1223 selects the output of the flip flop 1232.

The selector 1224 operates as a delay circuit to delay the output of the flip flop 1210 by a delay equal to those of the selector 1221 and the selector 1222. That is, the selector 1224 is not limited to a selector so long as it has a delay equal to those of the selector 1221 and the selector 1222.

The flip flop 1231 holds the received data signal (D) at a rising edge of clock signal CK270 or CK000 selected by the selector 1221.

The flip flop 1232 holds the received data signal (D) at a rising edge of clock signal CK090 or CK180 selected by the selector 1222.

The flip flop 1233 holds the output of the flip flop 1231 at a rising edge of clock signal CK180.

The flip flop 1233 is provided because of the following reasons.

When clock signal CK000 is selected by the selector 1221 and clock signal CK000 and the reference clock signal are in the same phase, the output of the flip flop 1231 may be output as it is.

However, in the actuality, a phase difference occurs between clock signal CK000 and the reference clock signal, and therefore, it is necessary to hold the output of the flip flop 1231 by the flip flop 1234 in synchronization with the reference clock signal. In this case, there is a possibility that the output of the flip flop 1231 is held by the flip flop 1234 before the output of the flip flop 1231 rises due to the phase difference between clock signal CK000 and the reference clock signal, resulting in latch miss.

In view of such, the resynchronization circuit of embodiment 1 includes the flip flop 1233. The flip flop 1233 holds the output of the flip flop 1231 in synchronization with clock signal CK180, thereby preventing latch miss.

In the case where clock signal CK270 is selected by the selector 1221, the output of the flip flop 1231 may be output to the selector 1223 as it is without being held by the flip flop 1233. However, according to embodiment 1, the output of the flip flop 1231 is held by the flip flop 1233 also in this case for simplification of the circuit structure.

The selectors 1221 to 1223 and the flip flops 1231 to 1233 constitute a holding circuit. This holding circuit holds the data in synchronization with a clock signal selected from among CK000, CK090, CK180 and CK270 which rises at a timing closest to the midpoint of a period where the received data signal (D) is output as a valid signal.

The flip flop 1234 holds the output of the selector 1223 at a rising edge of the reference clock signal.

The delay circuit 1240 delays the strobe signal by a delay equal to that of the flip flop 1210. As a result, the determination signal is in the same phase as the received data signal.

The delay circuit 1250 further delays the strobe signal delayed by the delay circuit 1240 by 45° (a ⅛ of a cycle of the reference clock signal) to output the delayed signal as strobe1T to the determination circuit 1100.

As described above, in embodiment 1, the determination signal is not the strobe signal itself but signal strobe1T which is delayed by 45° from the strobe signal. This is because of the following reasons.

For example, consider a case where a strobe signal delayed by the delay circuit 1240 is directly input to the determination circuit 1100 to carry out a determination with the four clock signals CK000, CK090, CK180 and CK270. A determination result indicates any of the four phase ranges, 0° to 90°, 90° to 180°, 180° to 270° and 270° to 0°.

If the determination result is "0° to 90°", ideally, the received data signal (D) is held in synchronization with a clock signal which rises at a counter edge (an edge having a phase different from that of any rising edge by 180°) of a clock signal having a phase of 45°, which is the median phase of the phase range 0° to 90°, i.e., in synchronization with a clock signal having a phase of 225°, whereby the received data signal (D) can be held at a timing closest to the midpoint of a period where the received data signal (D) is output as a valid signal.

However, clock signals CK000, CK090, CK180 and CK270 do not include a clock signal having a phase of 225°. Thus, in the actuality, the received data signal (D) is held in synchronization with the clock signal having a phase of 180° (CK180) or the clock signal having a phase of 270° (CK270). As a result, the received data signal (D) is held in synchronization with a clock signal which rises at a timing shifted forwardly or backwardly by 45° from the midpoint of a period where the received data signal (D) is output as a valid signal.

Figure 5:
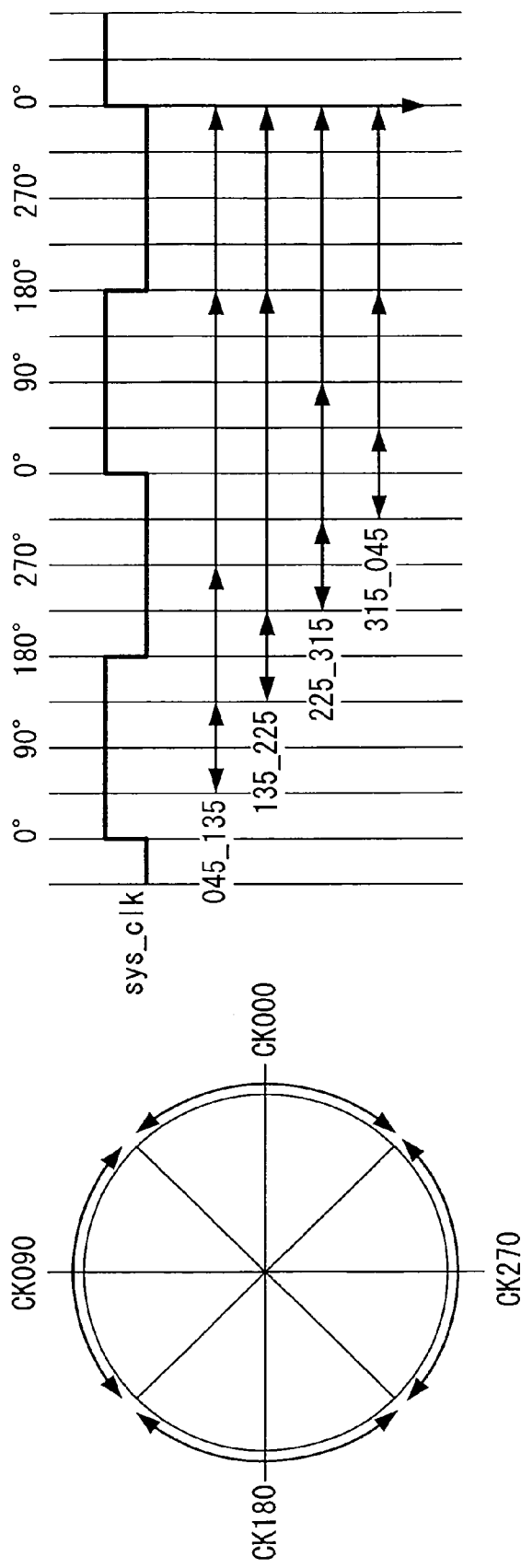
FIG. 5 shows the relationship between the phase range in which a determination signal (strobe1T) rises, the phase range in which a received data signal (D) rises, and a clock signal in synchronization with which the received data signal is held.

In view of such, in the resynchronization circuit 1000 of embodiment 1, signal strobe1T which is delayed by 45° from the strobe signal is used as a determination signal to carry out determination of a rising edge of the strobe signal, whereby a determination result indicates any of the four phase ranges, 45° to 135°, 135° to 225°, 225° to 315°, 315° to 45° as shown in FIG. 5. Thus, by selecting a clock signal having a phase opposite to the median phase of each of these phase range (any of CK270, CK000, CK090 and CK180), the received data signal (D) can be held at a timing closest to the midpoint of a period where the received data signal (D) is output as a valid signal. That is, the migration margin can be increased.

The charts of FIG. 5 illustrate the relationship between the phase range of a rising edge of the determination signal (strobe1T), the phase range of a rising edge of the received data signal (D), and the clock signal in synchronization with which the received data signal (D) is held. In the table of FIG. 5, the column of "1st latch" shows which of the output of the flip flop 1231 and the output of the flip flop 1232 is selected. In the column of "2nd latch", the box that shows "CK180" means that the flip flop 1233 holds the output of the flip flop 1231 in synchronization with clock signal CK180.

Figure 6:
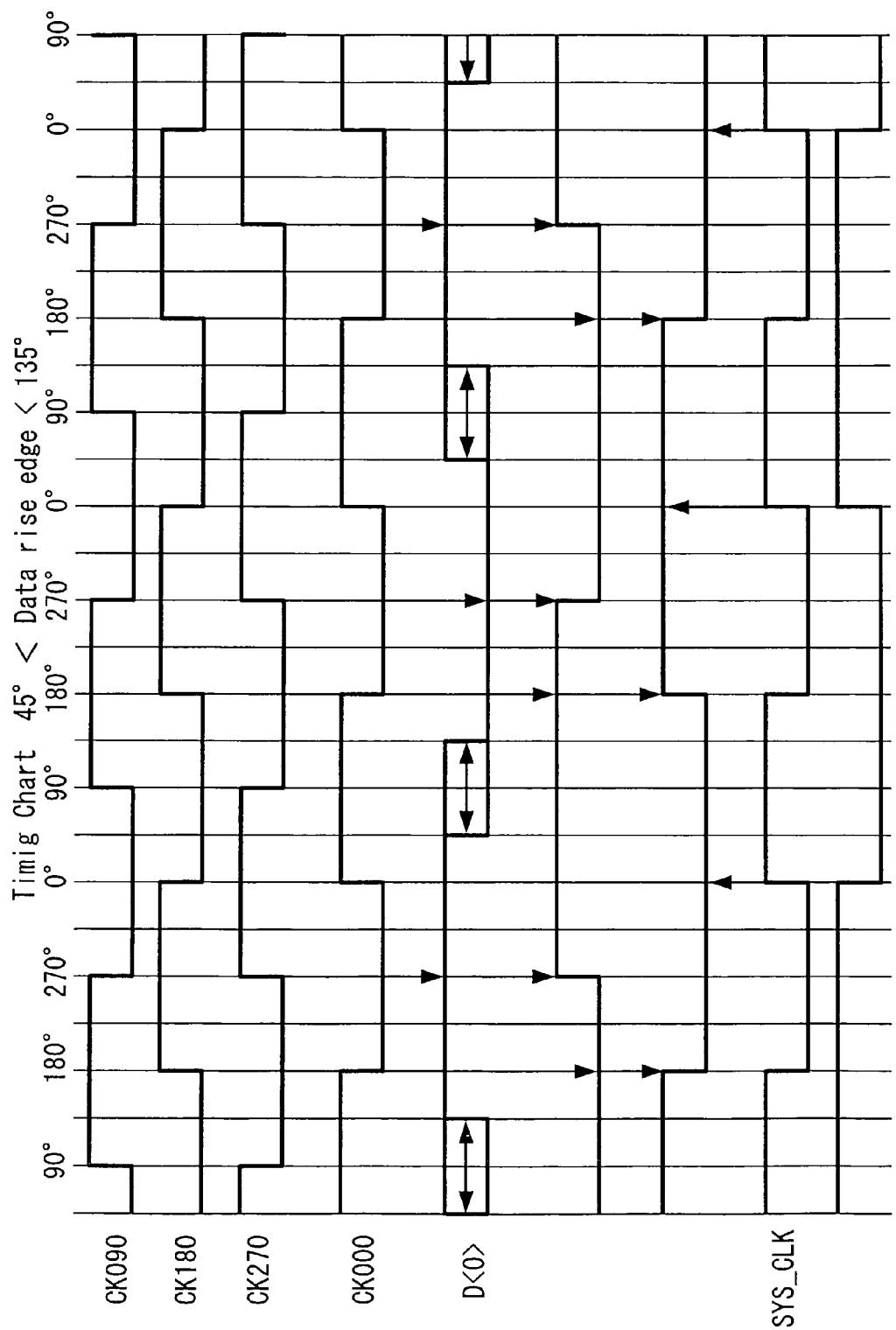
FIG. 6 is a timing chart which illustrates the relationship between a clock signal in synchronization with which the received data signal is held, the received data signal, and the output of the resynchronization circuit, where a rising edge of the received data signal is in the phase range of 45° to 135°.
Figure 7:
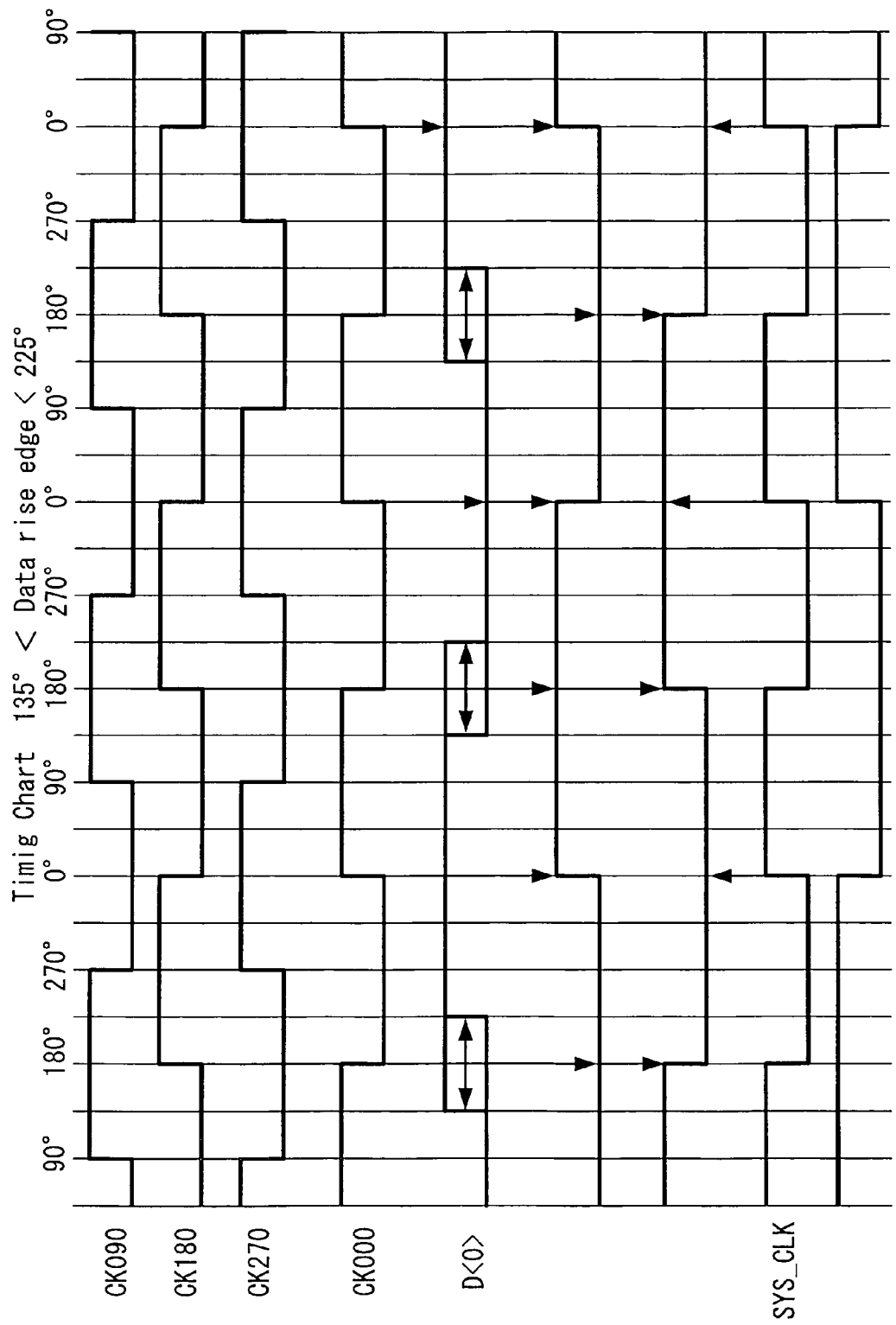
FIG. 7 is a timing chart which illustrates the relationship between a clock signal in synchronization with which the received data signal is held, the received data signal, and the output of the resynchronization circuit, where a rising edge of the received data signal is in the phase range of 135° to 225°.
Figure 8:
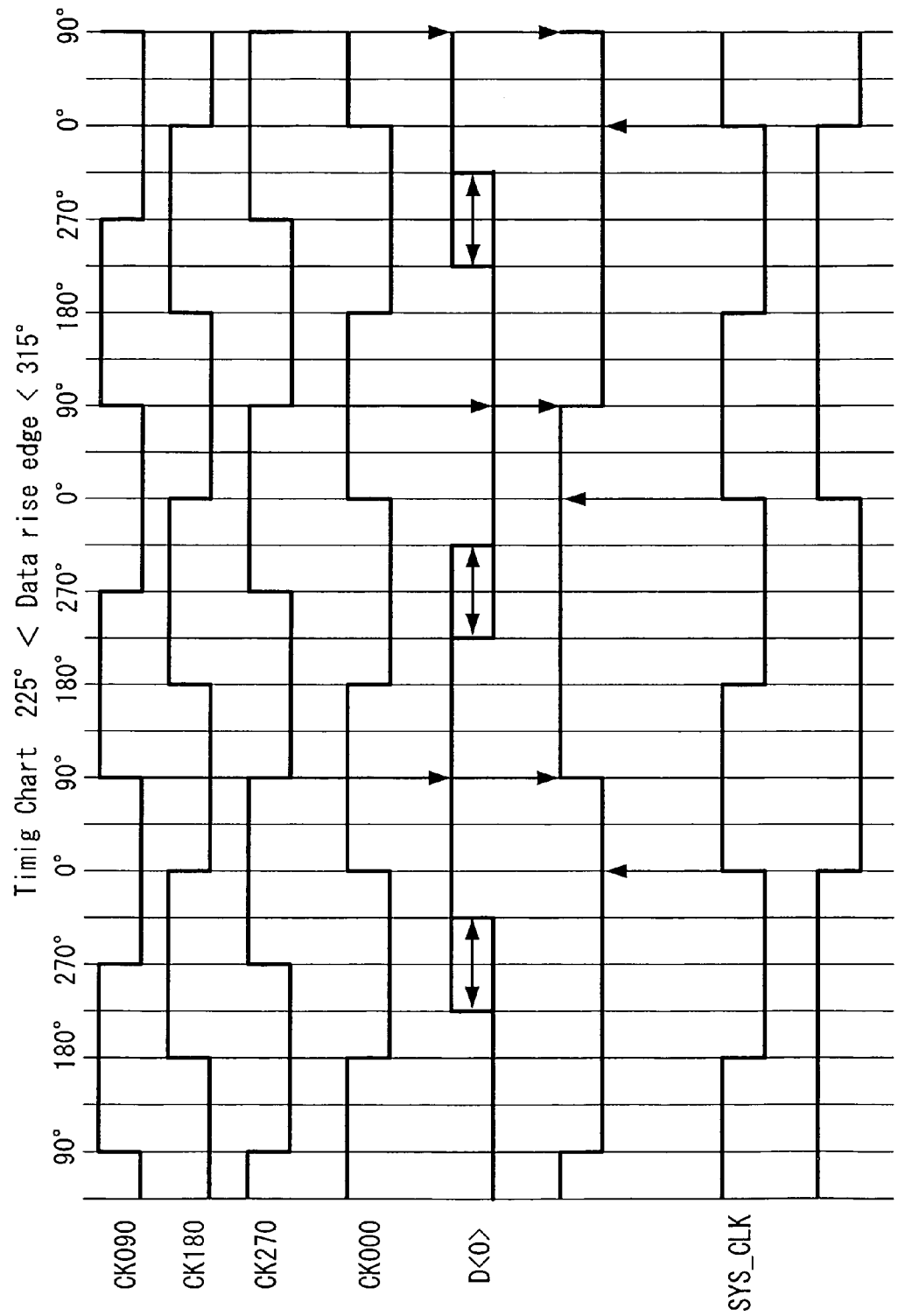
FIG. 8 is a timing chart which illustrates the relationship between a clock signal in synchronization with which the received data signal is held, the received data signal, and the output of the resynchronization circuit, where a rising edge of the received data signal is in the phase range of 225° to 315°.
Figure 9:
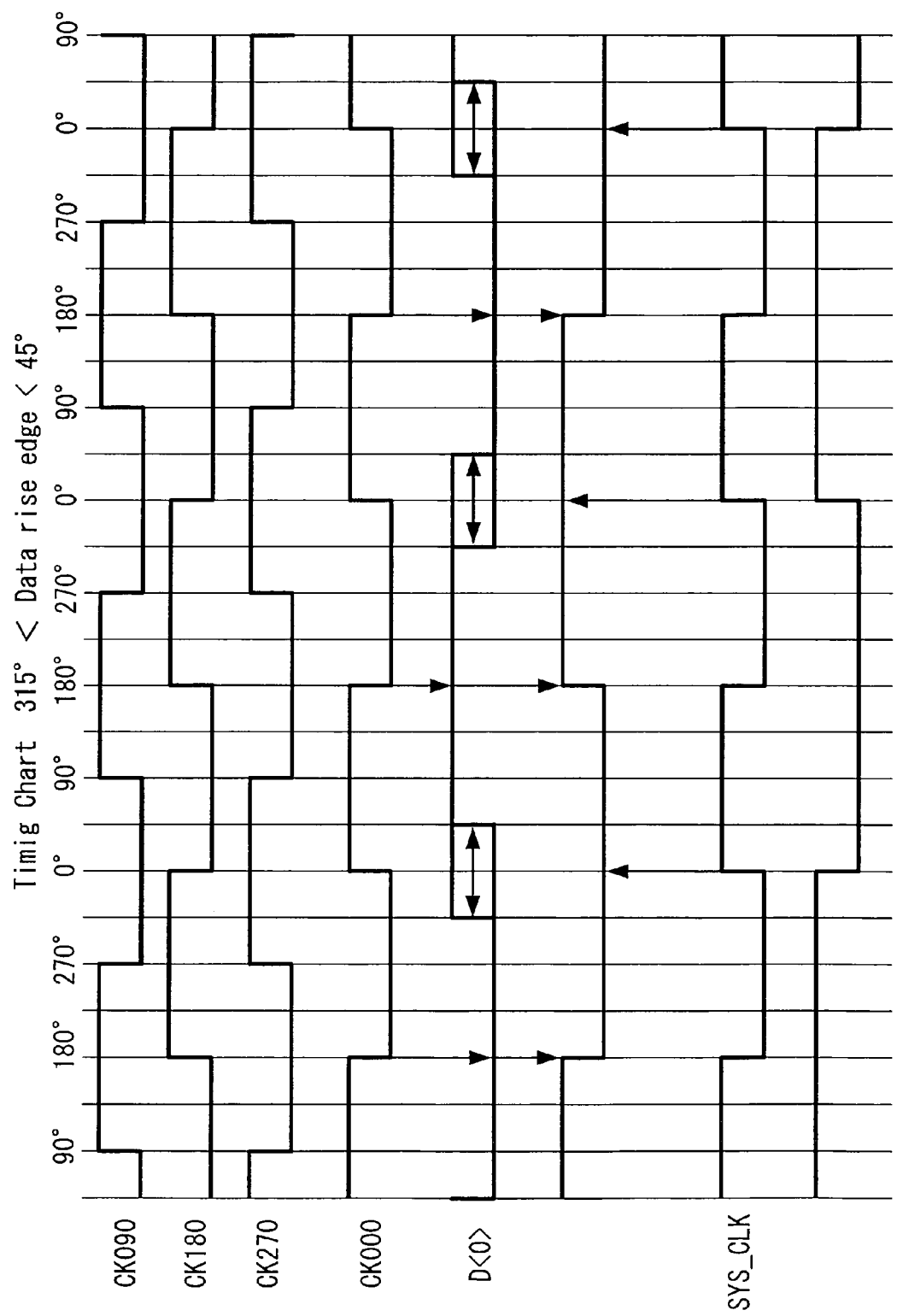
FIG. 9 is a timing chart which illustrates the relationship between a clock signal in synchronization with which the received data signal is held, the received data signal, and the output of the resynchronization circuit, where a rising edge of the received data signal is in the phase range of 315° to 45°.

FIGS. 6 through 9 are timing charts which illustrate the relationship between the clock signals in synchronization with which the received data signal is held, the received data signal, and the output of the resynchronization circuit 1000. FIG. 6 shows an example where a rising edge of the received data signal is in the phase range of 45° to 135°. In this example, the received data signal is first held in synchronization with clock signal CK270 and then held in synchronization with clock signal CK180. Thereafter, the received data signal is held in synchronization with the reference clock signal (SYS_CLK) and output from the resynchronization circuit 1000. FIG. 7 shows an example where a rising edge of the received data signal is in the phase range of 135° to 225°. FIG. 8 shows an example where a rising edge of the received data signal is in the phase range of 225° to 315°. FIG. 9 shows an example where a rising edge of the received data signal is in the phase range of 315° to 45°.

The migration margin increases as the number of phase ranges with which the determination is performed increases. It should be noted that, in such a case, the number of clock signal types to be generated is increased, and accordingly, the circuit scale is increased.

Since the resynchronization circuit of embodiment 1 uses four clock signals such that the determination result is any of four phase ranges, the delay of signal strobe1T is 45°. However, when the number of phase ranges used for determination is changed, signal strobe1T may be delayed only by a delay equal to a half of one phase range.

(Operation of Resynchronization Circuit)

In the resynchronization circuit 1000, prior to migration of the received data signal (D) between clock signals, the determination circuit 1100 determines in which phase range of the reference clock signal the strobe signal rises. The period where this determination operation is performed (determination period) needs to be a period where the logical value of the strobe signal is periodically inverted.

For example, when signal strobe1T input to the determination circuit 1100 rises in the phase of 90° to 180° during the determination period as shown in FIG. 4, the determination circuit 1100 operates as described below to output signals rsync_late and rsync_chph, both of which are at L-level, to the synchronization circuit block 1200.

When signal rsync_hold which is at H-level is input to the determination circuit 1100 from the control circuit and signal strobe1T is input to the determination circuit 1100 as the determination signal during the determination period, the flip flops 1111 to 1114 hold signal strobe1T at L-level, H-level, H-level, and L-level, respectively. The outputs of the flip flops 1111 to 1114 are decoded by the AND circuits 1121 to 1124 and the NOR circuits 1131 and 1133. Specifically, the AND circuits 1121 to 1124 outputs a H-level signal, a L-level signal, a L-level signal, and a L-level signal, respectively. As a result of decoding, the NOR circuits 1131 and 1133 both output L-level signals.

At this point in time, when the control circuit impels signal rsync_hold to transition from H-level to L-level, the flip flop 1141 and the flip flop 1142 hold the output of the NOR circuit 1131 and the output of the NOR circuit 1133, respectively, and outputs these held signals as signal rsync_late and signal rsync_chph (both at L-level) to the synchronization circuit block 1200.

After the end of the determination operation, the received data signal (D) input from a memory, or the like, is synchronized with the reference clock signal. If the received data signal (D) rises in the phase range of 90° to 180°, the received data signal (D) is held in synchronization with clock signal CK270 which rises at a timing closest to the midpoint of a period where the received data signal (D) is output as a valid signal. Then, the received data signal (D) is held in synchronization with the reference clock signal.

Specifically, since signal rsync_chph held by the determination circuit 1100 is at L-level, the selectors 1221 and 1222 operate such that clock signal CK270 is input to the flip flop 1231 and clock signal CK090 is input to the flip flop 1232. Each of the flip flops 1231 and 1232 holds the received data signal (D) in synchronization with the clock signal input thereto and outputs the held data signal. The output of the flip flop 1231 is further held by the flip flop 1232 in synchronization with clock signal CK180.

On the other hand, since signal rsync_late is at L-level, the selector 1223 selects the output of the flip flop 1233. The selected output is held by the flip flop 1234 in synchronization with the reference clock signal (SYS_CLK), and this held signal is output. The output of the flip flop 1234 is a signal (data) obtained as a result of migration of the received data signal from the strobe signal to the reference clock signal.

As described above, according to the present invention, it is determined in advance during the determination period in which phase range of the reference clock signal a rising edge of the strobe signal occurs. Thus, one received data signal (D) can be held in synchronization with a clock signal which rises at a timing closest to the midpoint of a period where the received data signal (D) is output as a valid signal. Therefore, even when the speed of the reference clock signal is increased, the received data signal can be transferred with a sufficient migration margin.

Since the determination result is held, a received data signal can be transferred even when the data is input based on a strobe signal which intermittently has a predetermined frequency.

In the example of embodiment 1, the outputs of the AND circuit 1124 and NOR circuit 1132 of the determination circuit 1100 are not used. However, any three of the outputs of the AND circuits 1121 to 1124 may be used so long as a predetermined decoding result shown in FIG. 3 is obtained. In this case, embodiment 1 of the present invention is not limited to the above example when a predetermined logic circuit is provided in place of the NOR circuits 1131 through 1133 to decode the outputs of the AND circuits.

The clock signals used in the update control block 1150 are not limited to clock signals CK000 and CK270, but any other two clock signals may be used so long as the phase difference between the two clock signals is 270°.

Embodiment 2

A resynchronization circuit of embodiment 2 of the present invention uses a reception data signal as a determination signal. In embodiments 2 and 3, elements which have equivalent functions as those of embodiment 1 are denoted by the same reference numerals, and the detailed descriptions thereof are omitted.

Figure 10:
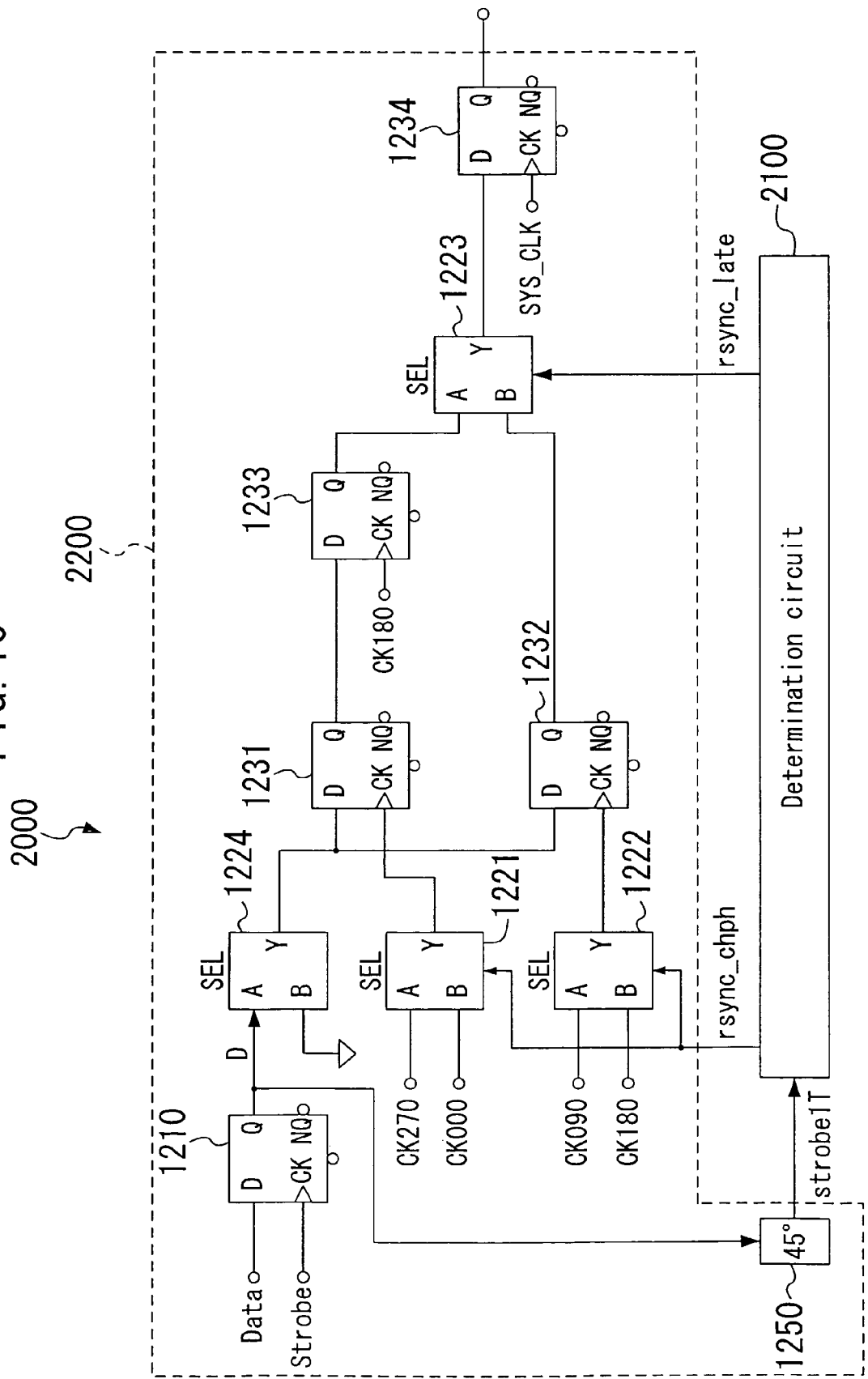
FIG. 10 is a block diagram showing a structure of a resynchronization circuit according to embodiment 2 of the present invention.

FIG. 10 is a block diagram showing a structure of the resynchronization circuit 2000 of embodiment 2. As shown in FIG. 10, the resynchronization circuit 2000 includes a determination circuit 2100 and a synchronization circuit block 2200.

The determination circuit 2100 is different from the determination circuit 1100 of embodiment 1 in that the determination circuit 2100 uses as the determination signal a received data signal in place of a strobe signal to determine in which phase range of the reference clock signal (SYS_CLK) the received data signal rises.

Figure 11:
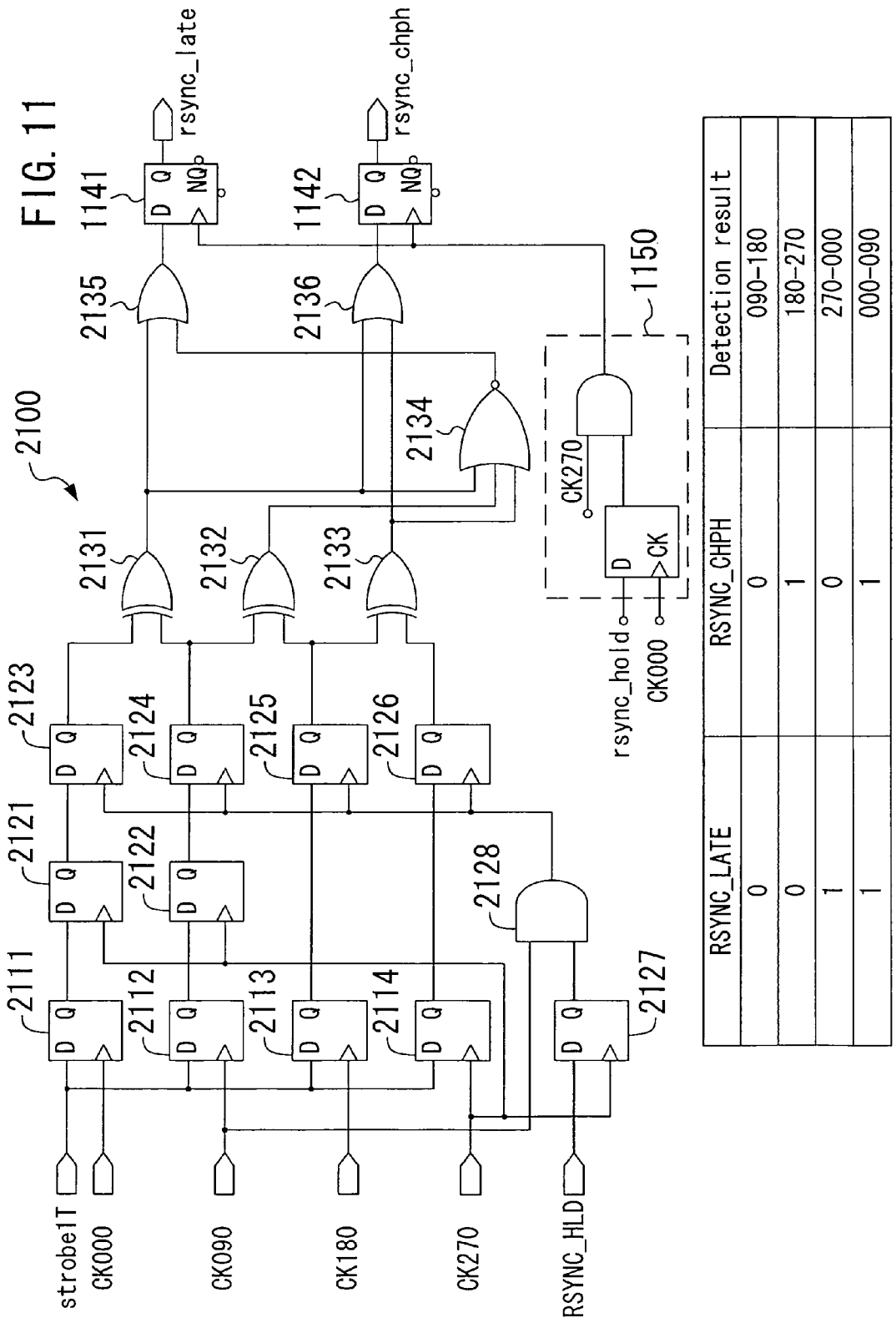
FIG. 11 is a block diagram showing another exemplary structure of the determination circuit.

Specifically, as shown in FIG. 11, the determination circuit 2100 includes flip flops 2111 to 2114, flip flops 2121 to 2127, a AND circuit 2128, EXOR circuits 2131 to 2133, an NOR circuit 2134, OR circuits 2135 and 2136, flip flops 2141 and 2142, and an update control block 1150.

A circuit section including the flip flops 2111 to 2114, the flip flops 2121 to 2127 and the AND circuit 2128 (hereinafter, referred to as "edge detection section") outputs a value determined according to in which phase range a rising edge (or falling edge) of the input determination signal (strobe1T) occurs, 90° to 180°, 180° to 270°, 270° to 0°, or 0° to 90°. This circuit section is equivalent to part of the determination circuit 1100 of FIG. 2 which includes the flip flops 1111 to 1114 and the AND circuits 1121 to 1124. It should be noted that the flip flops 2121 and 2122 are provided for timing adjustment of the flip flops 2123 to 2126. The edge detection section having such a structure is capable of faster operation as compared with embodiment 1.

The EXOR circuits 2131 to 2133, the NOR circuit 2134 and the OR circuits 2135 and 2136 decode the output of the edge detection section.

Thus, the determination circuit 2100 can determine in which phase range the received data signal changes irrespective of whether the received data signal changes at a rising edge or falling edge of the determination signal.

The table of FIG. 11 specifically shows the relationship between the phase range in which the input determination signal (strobe1T) rises or falls and the outputs of the determination circuit 2100 (rsync_late and rsync_chph). In the table of FIG. 11, value "1" means that the signal is at H-level, and value "0" means that the signal is at L-level.

The synchronization circuit block 2200 is different from the synchronization circuit block 1200 in that, as shown in FIG. 10, the delay circuit 1250 delays the received data signal (D) in place of the strobe signal and outputs the delayed received data signal (D) as signal strobe1T to the determination circuit 2100.

When a determination operation is performed with the resynchronization circuit having such a structure, the resynchronization circuit needs to receive, as the determination signal, data (Data) which alternates between H-level and L-level during a determination period. That is, it is necessary to systemically secure the data (Data) having such a data pattern during the determination period.

For example, when the resynchronization circuit receives data from a DDR-SDRAM and synchronizes the received data with a reference clock signal, data from which "0" and "1" can be alternately read is written through a write operation in a predetermined address region of the DDR-SDRAM in advance, and a determination period is provided at the time of start-up of the system, for example. During the determination period, a read operation is performed on the address region of the DDR-SDRAM.

As a result, the data (Data) input during a determination period alternates between H-level and L-level. Thus, it is possible to precisely determine the phase range in which the data changes.

Therefore, also in embodiment 2, even when the speed of the reference clock signal is increased, the received data signal can be transferred with a sufficient migration margin.

Since the determination result is held, a received data signal can be transferred even when the data is input based on a strobe signal which intermittently has a predetermined frequency.

In the resynchronization circuit of embodiment 2, the received data signal is used as the determination signal, and therefore, it is possible to more precisely determine the phase range in which the received data signal rises (or falls) even when the signal is delayed by the flip flop 1210.

Embodiment 3

A resynchronization circuit according to embodiment 3 of the present invention uses as a determination signal a signal obtained by dividing the frequency of a strobe signal.

Figure 12:
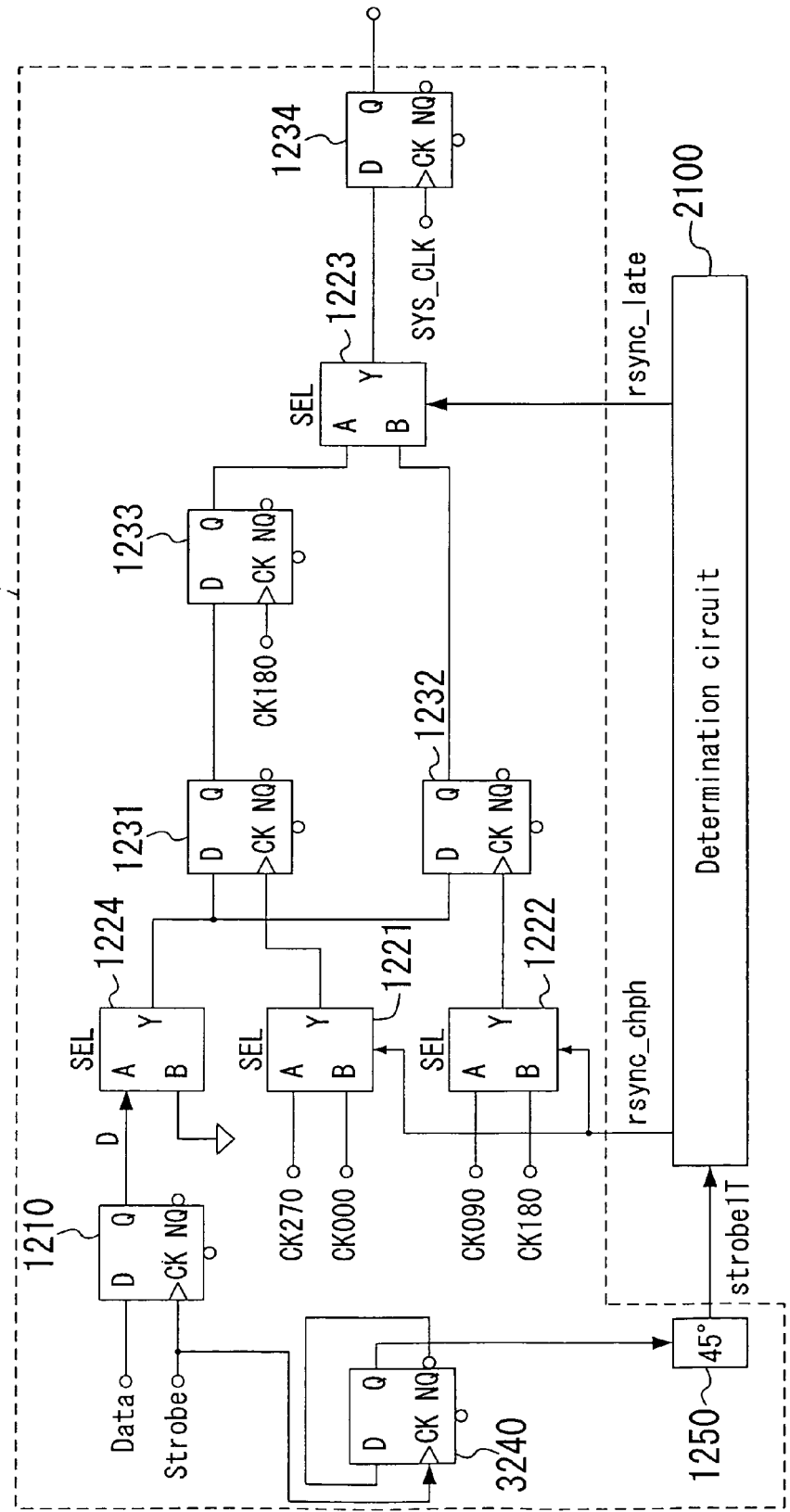
FIG. 12 is a block diagram showing a structure of a resynchronization circuit according to embodiment 3 of the present invention.

FIG. 12 is a block diagram showing a structure of the resynchronization circuit 3000 of embodiment 3. As shown in FIG. 12, the resynchronization circuit 3000 includes a determination circuit 2100 and a synchronization circuit block 3200.

In the synchronization circuit block 3200, the flip flop 3240 halves the frequency of a strobe signal (Strobe), and the delay circuit 1250 delays the frequency-halved strobe signal to output signal strobe1T to the determination circuit 2100.

By halving the frequency of the strobe signal in this way, a signal equivalent to the received data signal (D) that alternates between H-level and L-level can be generated from the strobe signal (i.e., an imitation signal of the received data signal (D) can be produced from the strobe signal). Thus, it is not necessary to write a determination signal in advance in a memory, or the like, such that "0" and "1" can be alternately read as in the resynchronization circuit of embodiment 2.

Also in embodiment 3 having the above-described structure, even when the speed of the reference clock signal is increased, the received data signal can be transferred with a sufficient migration margin.

Since the determination result is held, a received data signal can be transferred even when the data is input based on a strobe signal which intermittently has a predetermined frequency.

Since the signal delay time at the flip flop 1210 and the signal delay time at the flip flop 3240 are substantially the same, it is possible to more precisely determine the phase range in which the received data signal rises (or falls).

In the above examples of embodiments 1-3, the resynchronization circuit receives data output based on a strobe signal which intermittently has a predetermined frequency. However, the above embodiments of the present invention are applicable to a case where the resynchronization circuit receives data which is in synchronization with a serial clock signal.

In the above examples of embodiments 1-3, a period where no actual data is received is used as the determination period. However, it is possible that the determination operation is performed in parallel to reception of data, and the determination result is updated after the reception of data is completed. In this case, the resynchronization circuit may include update flip flops for holding the outputs of the flip flop 1141 and the flip flop 1142, and the update flip flops receive a signal for controlling the update operation from, for example, the outside of the resynchronization circuit.

The determination may be performed with a predetermined interval. In this case, the determination operation can be appropriately carried out even when the delay of a signal, or the like, is changed due to a variation in the temperature of the system LSI circuit which includes the resynchronization circuit of the present invention. Thus, resynchronization can be precisely performed. An example of the predetermined interval is a refresh interval of a DRAM (Dynamic Random Access Memory). Alternatively, in the case where a video data signal is input as the received data signal, a blanking interval of the video data signal may be used for the determination period.

Preferably, the determination period is provided in a period where a signal input to the resynchronization circuit has less noise. Thus, the determination operation is preferably performed when the noise is equal to or less than a predetermined level. In such a case, the determination of the phase range can be performed more precisely.

It should be noted that, even when the delay circuit 1250 is not provided, the determination of the phase range by the determination circuit 1100 or the determination circuit 2100 is possible. The present invention is not limited to an example where the clock signal in synchronization with which the received data signal (D) is held is determined by a single determination operation. For example, the determination circuit 1100 or 2100 may have a structure such that the determination operation is performed a plurality of times, and one determination result is selected based on majority rule.

Alternatively, the synchronization circuit block may have a structure such that one clock signal in synchronization with which the received data signal is held is selected from a plurality of clock signals, and the received data signal is held by one flip flop in synchronization with the selected clock signal. With such a structure, the number of flip flops can be decreased, and accordingly, the circuit scale can be decreased.

Alternatively, the synchronization circuit block may have a structure such that a flip flop for holding the received data signal is provided for each of a plurality of clock signals, and a signal which has the largest migration margin is selected from among the signals held by the flip flops. With such a structure, it is not necessary to provide a selector in a path of a clock signal, and as a result, the timing design is readily contrived, although the number of flip flops required is as large as the types of the plurality of clock signals.

It should also be noted that the above-described relationship between the levels of signals (logical values) and the meanings of the signal levels is merely exemplary, and the present invention is not limited thereto.

As described above, a resynchronization circuit of the present invention has a sufficient migration margin even when the speed of a clock signal used for outputting data is increased, and therefore, the data transfer speed can be increased. The resynchronization circuit of the present invention is useful as a resynchronization circuit wherein, in order to transfer data between circuits which use clock signals of the same frequency but different phases, data which is in synchronization with one of the clock signals is resynchronized with the other clock signal, and the resynchronized data is output.

What is claimed is:

1. A resynchronization circuit for synchronizing a received data signal with a reference clock signal which has a frequency equal to that of a strobe signal, the strobe signal being input to the resynchronization circuit together with the received data signal, comprising:
    a reception timing detection circuit for detecting in which of a plurality of phase ranges within one cycle of the reference clock signal the timing of determining the level of the received data signal occurs;
    a first holding circuit for holding the received data signal in synchronization with the strobe signal;
    a second holding circuit for holding an output of the first holding circuit in synchronization with a second holding circuit clock signal, the second holding circuit clock signal having the same frequency as that of the reference clock signal, the level of the second holding circuit clock signal transitioning in a phase range different from the phase range detected by the reception timing detection circuit;
    a third holding circuit for holding an output of the second holding circuit in synchronization with the reference clock signal; and
    a plurality of holding circuits for holding the output of the first holding circuit in synchronization with a plurality of said second holding circuit clock signals, the plurality of second holding circuit clock signals having the same frequency as that of the reference clock signal, the levels of the plurality of second holding circuit clock signals transitioning in different phase ranges from one another,
    wherein the second holding circuit holds a signal which is selected from the signals held by the plurality of holding circuits.

2. A resynchronization circuit for synchronizing a received data signal with a reference clock signal which has a frequency equal to that of a strobe signal, the strobe signal being input to the resynchronization circuit together with the received data signal, comprising:
    a reception timing detection circuit for detecting in which of a plurality of phase ranges within one cycle of the reference clock signal the timing of determining the level of the received data signal occurs;
    a first holding circuit for holding the received data signal in synchronization with the strobe signal;
    a second holding circuit for holding an output of the first holding circuit in synchronization with a second holding circuit clock signal, the second holding circuit clock signal having the same frequency as that of the reference clock signal, the level of the second holding circuit clock signal transitioning in a phase range different from the phase range detected by the reception timing detection circuit; and
    a third holding circuit for holding an output of the second holding circuit in synchronization with the reference clock signal,
    wherein the second holding circuit holds the output of the first holding circuit in synchronization with a clock signal selected from a plurality of said second holding circuit clock signals, the plurality of second holding circuit clock signals having the same frequency as that of the reference clock signal, the levels of the plurality of second holding circuit clock signals transitioning in different phase ranges from one another.

3. A resynchronization circuit for synchronizing a received data signal with a reference clock signal which has a frequency equal to that of a strobe signal, the strobe signal being input to the resynchronization circuit together with the received data signal, comprising:
    a reception timing detection circuit for detecting in which of a plurality of phase ranges within one cycle of the reference clock signal the timing of determining the level of the received data signal occurs;
    a first holding circuit for holding the received data signal in synchronization with the strobe signal;
    a second holding circuit for holding an output of the first holding circuit in synchronization with a second holding circuit clock signal, the second holding circuit clock signal having the same frequency as that of the reference clock signal, the level of the second holding circuit clock signal transitioning in a phase range different from the phase range detected by the reception timing detection circuit; and
    a third holding circuit for holding an output of the second holding circuit in synchronization with the reference clock signal,
    wherein:
    the reception timing detection circuit includes a plurality of holding circuits for holding a detection data signal in synchronization with a plurality of detection clock signals, the level of the detection data signal transitioning at the timing of determining the level of the received data signal, the detection clock signals having the same frequency as that of the reference clock signal, the levels of the plurality of detection clock signals transitioning in different phase ranges from one another; and
    the reception timing detection circuit performs the detection based on the levels of the signals held by the plurality of holding circuits.

4. The resynchronization circuit of claim 3, wherein:
    the level of the received data signal is periodically inverted; and
    the detection data signal is a signal generated by holding the received data signal by the first holding circuit.

5. The resynchronization circuit of claim 3, wherein the detection data signal is a signal generated by dividing the frequency of the strobe signal.

6. The resynchronization circuit of claim 3, wherein the detection data signal is a signal generated by delaying the strobe signal by a time equal to a delay of the first holding circuit.

7. The resynchronization circuit of claim 3, wherein the reception timing detection circuit holds a signal generated by delaying the detection data signal by a predetermined delay.

8. The resynchronization circuit of claim 7, wherein:
the plurality of phase ranges have the same extent; and
the predetermined delay by which the detection data signal is delayed is equal to a half of the extend of one phase range.

9. The resynchronization circuit of claim 1, wherein:
the reception timing detection circuit performs the detection during a predetermined detection period; and
the second holding circuit holds the output of the first holding circuit after the detection of the reception timing detection circuit.

10. The resynchronization circuit of claim 9, wherein:
the received data signal is a video data signal; and
the reception timing detection circuit performs the detection during a blanking interval of the video data signal.

11. The resynchronization circuit of claim 9, wherein:
the received data signal is output by a memory which has a refresh interval; and
the reception timing detection circuit performs the detection during the refresh interval of the memory.

12. The resynchronization circuit of claim 9, wherein the reception timing detection circuit performs the detection during a period when noise included in the detection data signal is equal to or less than a predetermined level.

13. The resynchronization circuit of claim 2, wherein:
the reception timing detection circuit performs the detection during a predetermined detection period; and
the second holding circuit holds the output of the first holding circuit after the detection of the reception timing detection circuit.

14. The resynchronization circuit of claim 13, wherein:
the received data signal is a video data signal; and
the reception timing detection circuit performs the detection during a blanking interval of the video data signal.

15. The resynchronization circuit of claim 13, wherein:
the received data signal is output by a memory which has a refresh interval; and
the reception timing detection circuit performs the detection during the refresh interval of the memory.

16. The resynchronization circuit of claim 13, wherein the reception timing detection circuit performs the detection during a period when noise included in the detection data signal is equal to or less than a predetermined level.

17. The resynchronization circuit of claim 3, wherein:
the reception timing detection circuit performs the detection during a predetermined detection period; and
the second holding circuit holds the output of the first holding circuit after the detection of the reception timing detection circuit.

18. The resynchronization circuit of claim 17, wherein:
the received data signal is a video data signal; and
the reception timing detection circuit performs the detection during a blanking interval of the video data signal.

19. The resynchronization circuit of claim 17, wherein:
the received data signal is output by a memory which has a refresh interval; and
the reception timing detection circuit performs the detection during the refresh interval of the memory.

20. The resynchronization circuit of claim 17, wherein the reception timing detection circuit performs the detection during a period when noise included in the detection data signal is equal to or less than a predetermined level.

* * * * *